United States Patent [19]

Sung et al.

[11] Patent Number: 5,750,474
[45] Date of Patent: May 12, 1998

[54] METHOD FOR MANUFACTURING A SUPERCONDUCTOR-INSULATOR-SUPERCONDUCTOR JOSEPHSON TUNNEL JUNCTION

[75] Inventors: Gun-Yong Sung; Jeong-Dae Suh, both of Daejeon, Rep. of Korea

[73] Assignee: Electronics and Telecommunications Research Institute, Daejeon, Rep. of Korea

[21] Appl. No.: 708,499

[22] Filed: Sep. 5, 1996

[30] Foreign Application Priority Data

Dec. 15, 1995 [KR] Rep. of Korea ............... 1995-50515

[51] Int. Cl.$^6$ ....................................... H01L 39/24
[52] U.S. Cl. ............................ 505/329; 505/474; 505/410; 505/413; 505/190; 505/238; 505/702; 505/728; 427/62; 427/63
[58] Field of Search .................. 505/329, 474, 505/190, 238, 410, 413, 702, 728; 427/62, 63

[56] References Cited

U.S. PATENT DOCUMENTS 5,324,714  6/1994  Inam et al. ..................... 505/190
5,627,139  5/1997  Chin et al. ..................... 505/238

FOREIGN PATENT DOCUMENTS

0484232A2  10/1991  European Pat. Off. .

Primary Examiner—Roy V. King
Attorney, Agent, or Firm—Nixon & Vanderhye P.C.

[57] ABSTRACT

A superconductor-insulator-superconductor Josephson tunnel junction, comprising: a single crystalline substrate having a perovskite crystal structure; a template layer formed of a b-axis oriented PBCO thin film on the substrate; and a trilayer structure consisting of a lower electrode, a barrier layer and an upper electrode, which serve as a superconductor, an insulator and a superconductor, respectively, the lower electrode and the upper electrode each being formed of an a-axis oriented YBCO superconducting thin film and having an oblique junction edge at an angle of 30° to 70°, the barrier layer being formed of an insulating thin film between the two superconducting electrodes, can be operated at a low power with an exceptional speed in calculation and data processing.

18 Claims, 4 Drawing Sheets

METHOD FOR MANUFACTURING A SUPERCONDUCTOR-INSULATOR-SUPERCONDUCTOR JOSEPHSON TUNNEL JUNCTION

BACKGROUND OF THE INVENTION

1. Field of the Invention

The present invention relates to an oxide superconducting three-layer junction, a main constituting factor of a superconducting device. More particularly, the present invention is directed to a superconductor-insulator-superconductor Josephson tunnel junction, which can be operated at a low power with an exceptional speed in calculation and data processing.

2. Description of the Prior Art

For application of electronic devices using high temperature superconductors, there are various necessary techniques including, for example, a process for making various materials into thin films, a process for manufacturing a multilayer structure consisting of the thin films and high temperature conductive layers and an integrating process. Such techniques are very important but much yet remains to be developed for them.

It is particularly well known that superconductor-insulator-superconductor insulator-superconductor (hereinafter referred to as "S—I—S") trilayer thin films are the fundamental structure for Josephson tunnel junctions as well as for high-frequency transmission lines or high-frequency filters.

In Josephson junctions, coherence length, which determines the thickness of non-conductive layer, has anisotropy for high temperature superconductors. It is known that, in $YBa_2Cu_3O_{7-x}$ (YBCO), the coherence length of the c axis direction, which is vertical to the Cu—O plane, is 0.2 to 0.7 nm whereas that of a- or b-axis direction, which is in the Cu—O plane, ranges from 1.3 to 3.4 nm. Therefore, because the thin film in which a- or b-axis is vertical to, that is, c-axis is parallel to the substrate (a-axis oriented thin film) has a coherence length ten times as long as that of the thin film in which c-axis is vertical to the substrate (c-axis oriented thin film), the growth of the a-axis oriented thin film is very critical to the manufacture of planar Josephson junction.

Of various Josephson junctions, the planar trilayer thin film Josephson junction is of significant importance in an engineering aspect by virtue of its ready application for electronic devices. Among the insulators for S—I—S junctions which have been reported thus far, are $SrTiO_3$ (J. J. Kingstone et al, Appl. Phys. Lett. 56, 189 (1990)), $Y_2O_3$ (K. Hirata et al, Appl. Phys. Lett. 56, 683 (1990)), MgO (S. Tanaka et al, IEEE Trans. Magn. MAG-27, 1607 (1991)), $LaAlO_3$ (J. M. Pond et al, Appl. PhYS. lETT. 59, 3033 (1991)), $NdGaO_3$ (Y. Baikov et al, Appl. Phys. Lett. 56, 2606 (1991)), $CeO_2$ (T. Kusumori et al, Jpn. J. Appl. Phys. Lett 56 (1992)), and $PrGaO_3$ (M. Mukidida et al, Jpn. J. Appl. Phys. 33, 2521 (1994)). But, planar S—I—S Josephson junctions are still in the developing stages owing to the problem of manufacturing a multilayer structure of complicated perovskite oxides.

In order to better understand the background of the present invention, a description will be given of conventional junction structures in conjugation with some drawings.

First, referring to FIG. 1, there is a conventional structure of a superconductor-metal-superconductor angle junction. To fabricate it, a c-axis oriented YBCO thin film is initially formed over a substrate 1, to make a lower electrode 8 atop which an insulator 9 is then formed. The lower electrode 8 and the insulator 9 both are etched obliquely after which a barrier layer 5 is formed. Over the barrier layer 5 is formed a c-axis oriented YBCO thin film, to make an upper electrode 10.

Referring to FIG. 2, there is a conventional structure of an S—I—S planar sandwich junction. As shown in this drawing, a structure in which a barrier layer 5 is sandwiched between a lower electrode 3 of a-axis oriented YBCO thin film and an upper electrode 5 of a-axis oriented YBCO thin film, is formed on a substrate 1.

As one of the related conventional arts, EP 0 484 232 A2, entitled "Superconducting device having an extremely short superconducting channel formed of oxide superconductor material and method for manufacturing the same", is known. The above-cited patent is directed to a superconducting field effect device using a superconducting channel at an angle to a substrate. Such a superconducting channel is accomplished by obliquely etching a lower superconducting layer and an insulating layer at an edge, depositing a barrier layer and an upper superconducting layer in order and etching them, as in FIG. 1.

U.S. Pat. No. 5,250,817, entitled "Alkali barrier superconductor Josephson junction and circuit", discloses a planar sandwich Josephson junction similar to that of FIG. 2, which can be obtained by depositing sequentially a superconducting layer, an insulating layer and a superconducting layer and etching down the surface of the lower superconducting layer.

A significant disadvantage of the above-mentioned conventional techniques is that the reproducibility in the surface planarization of superconducting oxide thin film and in the etching processes remains poor, resulting in poor junction properties.

SUMMARY OF THE INVENTION

Therefore, it is an object of the present invention to overcome the above problems encountered in prior arts and to provide a planar S—I—S Josephson tunnel junction employing an insulator sandwiched between two in-plane a-axis oriented YBCO thin films, each having an oblique edge at an angle, which is superior in junction properties.

It is another object of the present invention to provide a method for manufacturing such S—I—S Josephson tunnel junctions.

In accordance with an aspect of the present invention, there is provided a superconductor-insulator-superconductor Josephson tunnel junction, comprising: a singlecrystalline substrate having a perovskite crystal structure; a template layer formed of a b-axis oriented PBCO thin film on said substrate; and a trilayer structure consisting of a lower electrode, a barrier layer and an upper electrode, which serve as a superconductor, an insulator and a superconductor, respectively, said lower electrode and said upper electrode each being formed of an a-axis oriented YBCO superconducting thin film and having an oblique junction edge at an angle of 30° to 70°, said barrier layer being formed of an insulating thin film between said two superconducting electrodes.

In accordance with another aspect of the present invention, there is provided a method for manufacturing a superconductor-insulator-superconductor Josephson tunnel junction, comprising the steps of: fixing an oxide single crystalline substrate in which a high temperature superconducting thin film is grown, to a substrate heating plate by use of a silver adhesive; depositing a PBCO template layer on said substrate by a pulse laser deposition process; depositing an a-axis oriented YBCO lower electrode on said PBCO template layer by a laser deposition process; dry-etching said a-axis oriented YBCO lower electrode while illuminating argon ion beams at an incident angle of 20° to 80°; depositing a barrier layer over the etched YBCO lower electrode by a pulse laser deposition process; depositing an a-axis oriented YBCO upper electrode over said barrier layer; and subjecting both said barrier layer and said YBCO upper electrode to dry etch.

BRIEF DESCRIPTION OF THE DRAWINGS

The above and other objects and aspects of the invention will become apparent from the following description of embodiments with reference to the accompanying drawings in which.

DETAILED DESCRIPTION OF THE PREFERRED EMBODIMENTS

Figure 1:
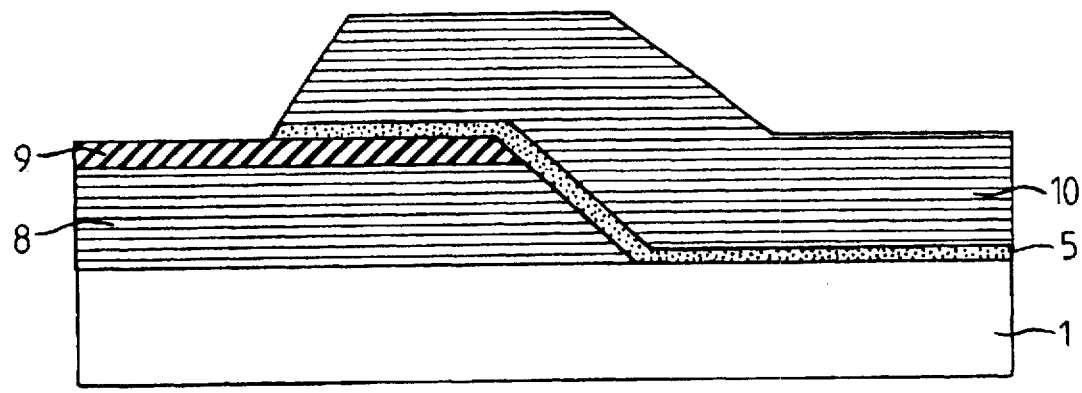
FIG. 1 is a schematic cross sectional view showing a conventional structure of a S—I—S angle junction.

The application of the preferred embodiments of the present invention is best understood with reference to the accompanying drawings, wherein like reference numerals are used for like and corresponding parts, respectively.

Figure 3:
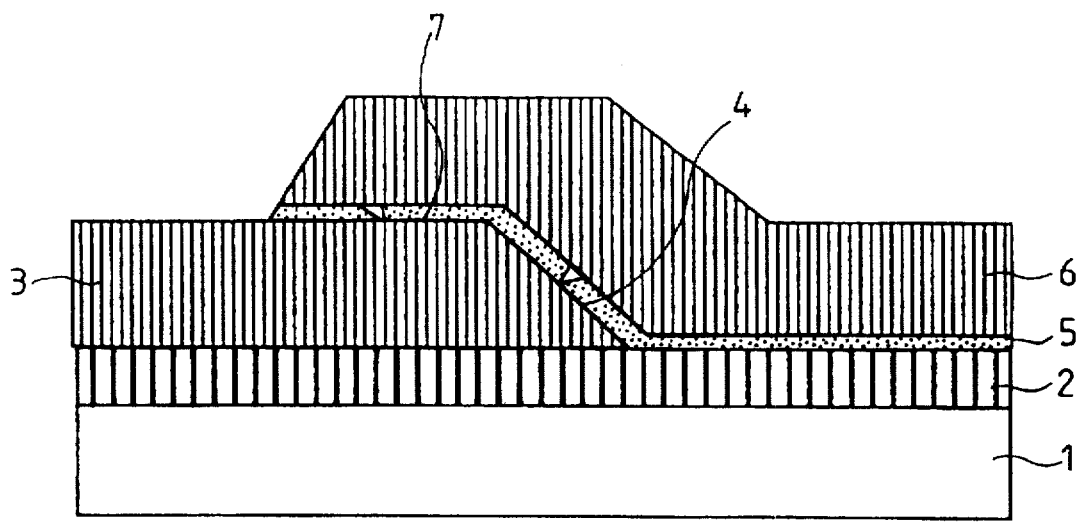
FIG. 3 is a schematic cross sectional view showing a structure of a S—I—S tunnel junction according to the present invention.

Referring to FIG. 3, there is shown a structure of a S—I—S junction according to the present invention. As shown in FIG. 3, a substrate in which a b-axis oriented $PrBa_2Cu_3O_{7-x}$, (PBCO) 100 nm thick is deposited as a template layer 2 on a single crystal 1 having a perovskite crystal structure, such as $SrTiO_3$, (100), $LaAlO_3$(100), LaSrGaO (100), $LaSrAlO_4$ (100), $PrGaO_3$ (100) or $Nd_2CuO_4$ (100), is provided. On this substrate is formed a trilayer junction consisting of a lower electrode 3, a barrier layer 5 and an upper electrode 6. The lower electrode 3 is formed of an a-axis oriented YBCO superconducting thin film with an oblique junction edge at an angle of 30° to 70°. For the upper electrode 6, an a-axis oriented YBCO superconducting thin film with a thickness of 200 to 300 nm is provided. These two superconducting thin films are separated by the barrier layer 5 with a thickness of 2–5 nm which is formed of an insulating thin film such as $LaSrGaO_4$, $LaSrAlO_4$, $PrGaO_3$ and $Nd_2CuO_4$.

Referring to FIG. 4, there is shown a method for manufacturing the S—I—S Josephson junction using an oxide superconducting trilayer film in accordance with the present invention. It will be in detail described in connection with FIGS. 4A through 4F.

Figure 4A:
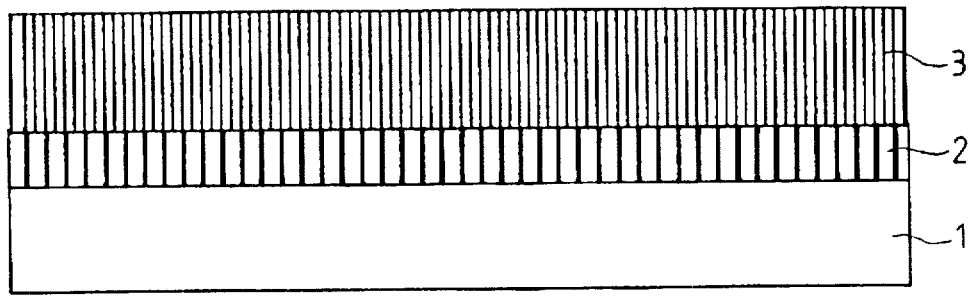
FIGS. 4A,4B,4C,4D,4E, and 4F are schematic cross sectional views showing a method for manufacturing the S—I—S tunnel junction according to the present invention.

FIG. 4A is a cross section after a PBCO template layer 2 is deposited on an oxide single crystal substrate 1, followed by the formation of an a-axis oriented YBCO electrode 3 over the PBCO template layer 2. Above all things, the single crystal substrate 1, in which a high temperature superconducting thin film is grown, is bonded on the substrate heating plate of a pulse laser depositor by a silver adhesive. Thus, the PBCO template layer 2 is deposited to a thickness of 50 to 200 nm at 600° to 650° C. under an oxygen pressure of 100 mTorr by a pulse laser deposition process. It is also applied for the formation of the YBCO electrode 3. In this case, the pulse laser deposition process is carried out at 720° to 780° C. under an oxygen pressure of 100 mTorr until the YBCO electrode 3 grows to a thickness of 200 to 300 nm.

Figure 4B:
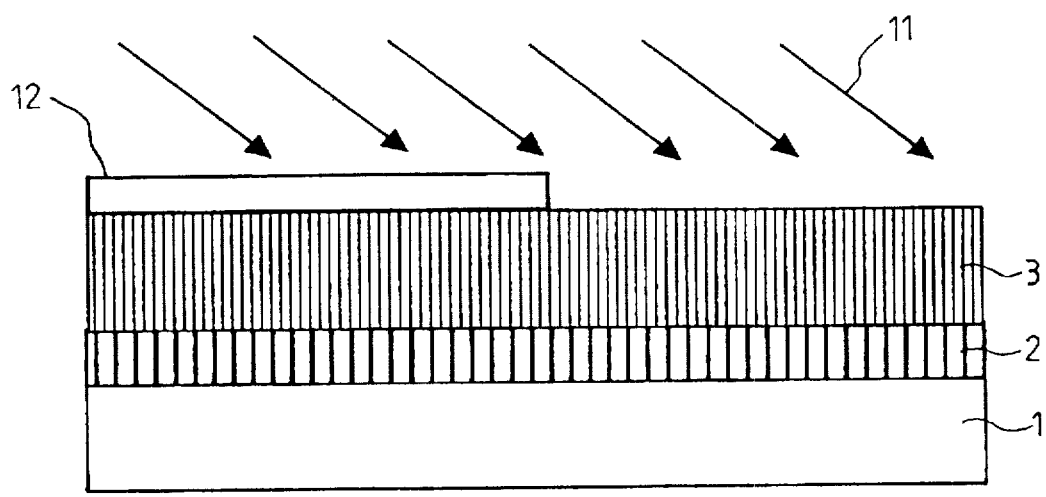

FIG. 4B is a cross section after a protector 12 is formed on a predetermined surface area of the YBCO electrode 3, followed by the illumination of incident argon ion beams upon the YBCO electrode 3. The beams are projected at an angle of 30° to 70° to the YBCO electrode 3, as indicated by arrows.

Figure 4C:
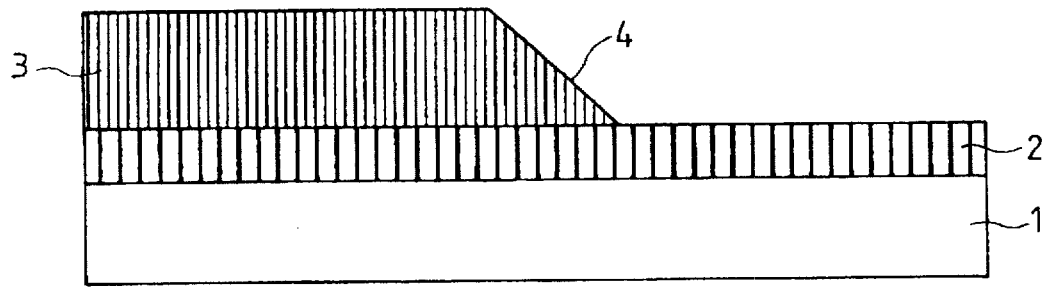

FIG. 4C is a cross section after the YBCO electrode 3 is dry-etched. As a result, a lower electrode 3 with an oblique edge at an angle of 30° to 70° is obtained.

Figure 4D:
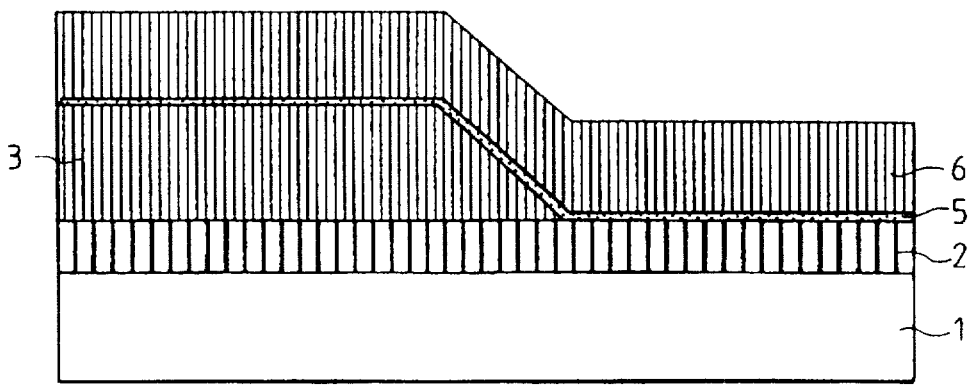

FIG. 4D is a cross section after a barrier layer 5 consisting of an insulating film 2–5 nm thick is formed on the etched a-axis oriented YBCO lower electrode 3 through pulse laser deposition, followed by the deposition of an a-axis oriented YBCO upper electrode 6 over the barrier layer 5. In the latter case, laser deposition is carried out at 720° to 780° C. under an oxygen pressure of 100 mTorr until the a-axis YBCO upper electrode 6 grows into a thickness of 200 to 300 nm.

Figure 4E:
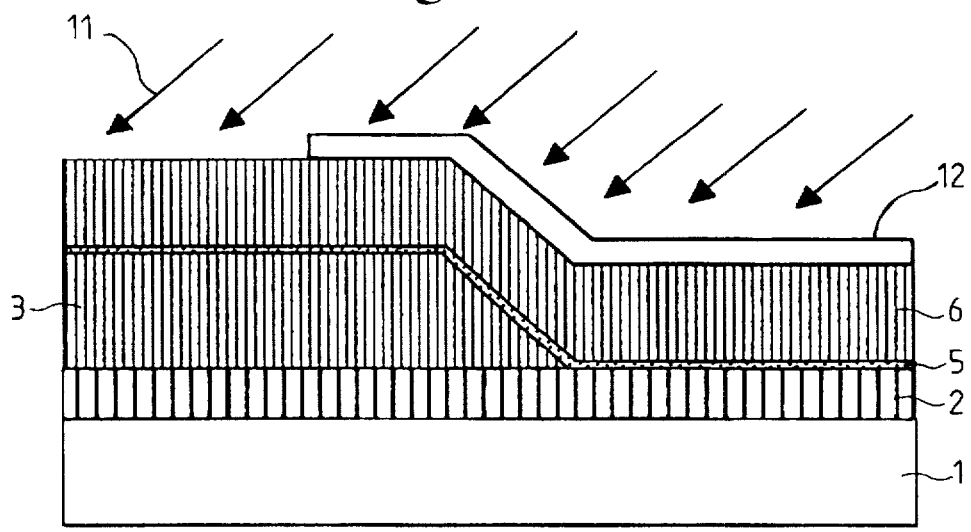

FIG. 4E is a cross section after a protector 12 is formed on a predetermined surface area of the upper electrode 6, followed by the illumination of incident argon ion beams upon the upper electrode 6 as indicated by the arrows.

Figure 4F:
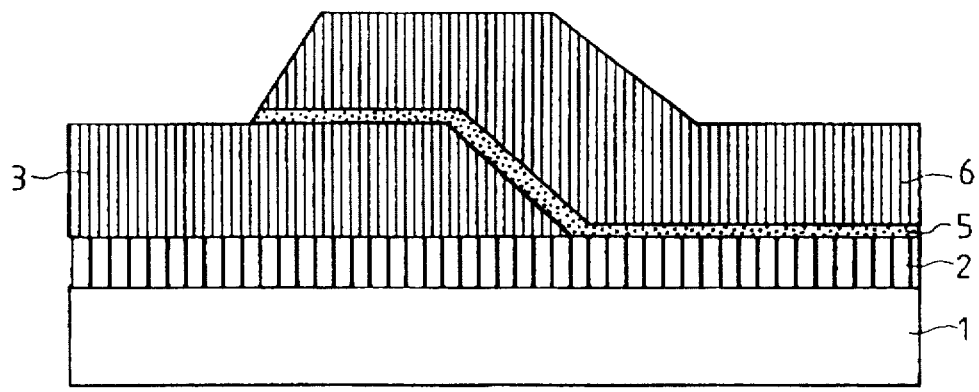

FIG. 4F is a cross section after the a-axis oriented YBCO upper electrode 6 and the barrier 5 both are subjected to dry etch, to give a planar S—I—S Josephson tunnel junction.

The anisotropy of the YBCO crystal structure allows the superconducting properties of the YBCO thin film to vary greatly with each crystal axis. Since the upper electrode 6 and the lower electrode 3 both are formed of a-axis oriented YBCO thin film, the coherence length vertically directed to the substrate is about ten times as long as that parallel thereto. In addition, currents practically flow from the upper electrode 6 through the planar junction part 7 to the lower electrode 3 or reversely flow because the area of the planar junction part 7 is quite large relative to that of the edge junction part 4.

Figure 2:
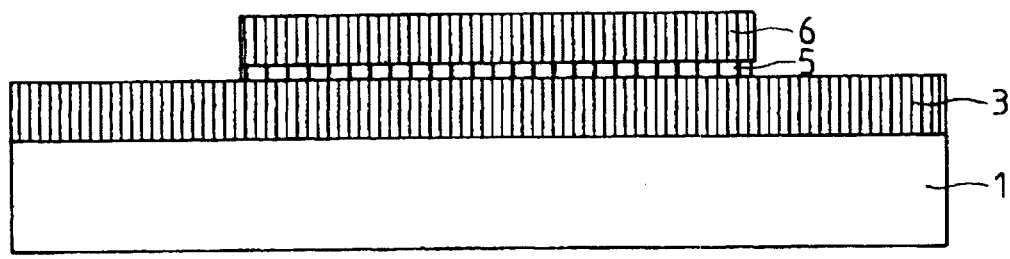
FIG. 2 is a schematic cross sectional view showing another conventional structure of a S—I—S planar sandwich junction.

Therefore, the S—I—S Josephson junction of the present invention is similar, in structure, to the conventional angle junction according to T. Nagamura et al, EP 0 484 232 A2 as shown in FIG. 1 and identical, in current path, to the conventional planar sandwich junction according to R. L. Fink, U.S. Pat. No 005,250,817 A as shown in FIG. 2.

Consequently, as described hereinbefore, the present invention is superior to the conventional planar sandwich junction technique in the reproducibility of etching process. In the S—I—S Josephson junction of the present invention, the junction formation is possible even under the condition of thick barrier layer by virtue of the use of a-axis oriented YBCO thin film. The S—I—S Josephson junction in accordance with the present invention has an advantage of processing image signals and satellite signals and operating high performance work stations and super computers at high speeds and at low powers.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A method for manufacturing a superconductor-insulator-superconductor Josephson tunnel junction, said method comprising the steps of:

(a) fixing an oxide single crystalline substrate on which a high temperature superconducting thin film is to be grown, to a substrate heating plate of a pulse laser depositor by use of a silver adhesive;

(b) depositing a $PrBa_2 Cu_3O_{7-x}$ (PBCO) template layer on said substrate by a pulse laser deposition process;

(c) depositing an a-axis oriented $YBa_2Cu_3O_{7-x}$ (YBCO) lower electrode on said PBCO template layer by a laser deposition process;

(d) dry-etching said a-axis oriented YBCO lower electrode while illuminating argon ion beams at an incident angle of 20° to 80° thereby forming the lower electrode with an oblique edge at an angle of 20° to 80°;

(e) depositing a barrier layer over the etched YBCO lower electrode by a pulse laser deposition process;

(f) depositing an a-axis oriented YBCO upper electrode over said barrier layer; and (g) subjecting said barrier layer and said YBCO upper electrode both to dry etch thereby forming the barrier layer and the YBCO upper electrode with an oblique edge at an angle of 20° to 80°.

2. A method in accordance with claim 1, wherein said PBCO template layer is deposited at a temperature of 550° to 700° C.

3. A method in accordance with claim 1, wherein said PBCO template layer is deposited at an oxygen pressure of 90 to 110 mTorr.

4. A method in accordance with claim 1, wherein said PBCO template layer is deposited at a thickness of 40 to 250 nm.

5. A method in accordance with claim 1, wherein said a-axis oriented lower YBCO layer is deposited at a temperature of 680° to 850° C.

6. A method in accordance with claim 1, wherein said a-axis oriented lower YBCO layer is deposited at an oxygen pressure of 90 to 110 mTorr.

7. A method in accordance with claim 1, wherein said a-axis oriented lower YBCO layer is deposited at a thickness of 150 to 350 nm.

8. A method in accordance with claim 1, wherein said dry etching step (d) is carried out with an incident angle of argon ion beams ranging from 30° to 70°.

9. A method in accordance with claim 1, wherein said dry etching step (d) results in a lower electrode having an oblique edge at an angle of 20° to 80°.

10. A method in accordance with claim 1, wherein said barrier layer is deposited at a thickness of 1.5 to 6 nm with an insulating film.

11. A method in accordance with claim 1, wherein said a-axis oriented YBCO upper electrode is deposited at a temperature of 650° to 850°.

12. A method in accordance with claim 1, wherein said a-axis oriented YBCO upper electrode is deposited at an oxygen pressure of 90 to 110 mTorr.

13. A method in accordance with claim 1, wherein said a-axis oriented YBCO upper electrode is deposited at a thickness of 150 to 350 nm.

14. A method in accordance with claim 1, wherein said lower electrode and said upper electrode each are formed of an in-plane a-axis oriented YBCO thin film.

15. A method in accordance with claim 1, wherein said lower electrode and said upper electrode each have an oblique edge at an angle of 20° to 800°.

16. A method in accordance with claim 1, wherein said barrier layer is formed into a thickness of 1.5 to 6 nm with a thin film selected from the group consisting of $LaSrGaO_4$, $LaSrAlO_4$, $PrGaO_3$ and $Nd_2CuO_4$.

17. A method in accordance with claim 1, wherein said substrate is formed of a single crystal selected from the group consisting of $LaSrGaO_4$, $LaSrAlO_4$, $PrGaO_3$ and $Nd_2CuO_4$.

18. A method in accordance with claim 1, wherein said template layer is formed of a b-axis oriented PBCO thin film having a thickness of 90 to 110 nm.

* * * * *